United States Patent [19]
Chiang et al.

[11] Patent Number: 5,950,223
[45] Date of Patent: Sep. 7, 1999

[54] DUAL-EDGE EXTENDED DATA OUT MEMORY

[75] Inventors: Paul M-Bhor Chiang, Cupertino; Michael G. Fung, Los Altos, both of Calif.

[73] Assignee: Silicon Magic Corporation, Santa Clara, Calif.

[21] Appl. No.: 08/879,069

[22] Filed: Jun. 19, 1997

[51] Int. Cl.$^6$ .................................................. G06F 12/00
[52] U.S. Cl. .............................. 711/105; 711/5; 711/167; 365/230.03; 365/193
[58] Field of Search .............................. 711/5, 105, 167; 365/230.02, 230.03, 193, 189.02

[56] References Cited

U.S. PATENT DOCUMENTS

| | | | |
|---|---|---|---|
| 5,341,488 | 8/1994 | Kobayashi | 711/5 |
| 5,479,635 | 12/1995 | Kametani | 711/5 |
| 5,729,709 | 3/1998 | Harness | 711/5 |

OTHER PUBLICATIONS

"64Mb DDR SDRAM"; Samsung Semiconductor Inc, North America; http://www.usa.samsungsemi.com/newproducts/64mbddrsdram_brief.htm; Dec. 1998.

Prince, Betty. "High Performance Memories New Architecture DRAMs and SRAMs–evolution and function"; John Wiley & Sons; Dec. 1996; pp. 205–209.

"Draft Standard for A High–Speed Memory Interface (SyncLink)"; IEEE Standards Department; Dec. 1996.

*Primary Examiner*—Reginald G. Bragdon
*Attorney, Agent, or Firm*—Sawyer & Associates

[57] ABSTRACT

A memory is modified so that read and write data are transferred on both rising and falling edges of a timing signal, thereby essentially doubling the data transfer rate from memory. In one embodiment, a dual-edge extended data out (DE$^2$DO) memory includes modified and improved circuits and operating methods, as compared to a standard extended data out (EDO) memory, so that read and write data are transferred on both rising and falling edges of a timing signal. In a described embodiment, DE$^2$DO dynamic RAM (DRAM) reads and writes data on the rising and falling edges of a column address strobe (CAS) timing signal. By transferring data on both the rising and falling edges of the timing signal, the data transfer rate to and from the memory is effectively doubled.

20 Claims, 6 Drawing Sheets

Dual Edge EDO Read Cycle Timing

Fast Page Mode

Extended Data Out (EDO) Mode

Read Transfer

Write Transfer

DUAL-EDGE EXTENDED DATA OUT MEMORY

FIELD OF THE INVENTION

The present invention relates generally to memory circuits. More specifically, the invention relates to dynamic random access memory circuits which improve memory speed performance.

BACKGROUND OF THE INVENTION

Performance of computers, data handling systems, information systems and, particularly, graphic display systems is highly dependent on memory performance. Continuing improvements in memory bandwidth and latency performance directly relate to increased usefulness and productivity of these various systems.

Improvements in memory technology basically refer to improvements in memory density and memory speed. Various techniques have been implemented to improve memory speed performance. One such technique utilizes interleaved memory. Memory chips are typically organized in banks so that, instead of a single word, multiple data words are read or written at one time. The memory banks are one word wide so that the width of a memory bank does not change, but addresses are sent to several banks simultaneously, so that all memories are accessed at one time. While consecutive memory write operations normally require that a later write operation must wait for an earlier operation to finish, separation of memory into banks allow one clock cycle for each write operation, so long as the write operations are not directed to the same memory bank. Accordingly, the mapping of addresses to memory banks affects the speed performance of the memory. An interleaved memory improves memory speed performance by optimizing sequential memory accesses and allowing multiple independent memory accesses. Utilization of multiple memory controllers allows memory banks to operate independently. However, interleaved memory techniques unfortunately have some disadvantages. One disadvantage is that interleaved memories generally require multiple memory chips, increasing the size and expense of a memory system. Another disadvantage of interleaved memories is the difficulty of main memory expansion. Because memory control hardware is likely to control equal-sized memory banks, memory expansion will generally require doubling of a memory size.

Another technique for improving memory speed performance is usage of fast page mode operation. Dynamic random access memories (DRAMs), in general, are accessed by dividing memory accesses into row accesses and column accesses. Each row access results in a row of bits buffered inside the DRAM for subsequent column accesses. Typically, a DRAM row size is the square root of the DRAM size. Fast page mode operation optimizes memory speed performance by supplying timing signals that allow repeated accesses to the row buffer without repeating the time required for a row access. Thus, the individual bits inside the row buffer are accessed much as a static RAM is accessed— the bits are accessed randomly in the buffer by changing the column address until the next row access takes place. An advantage of fast page mode operation is that the optimization is achieved using essentially only the circuitry already present on the DRAM chip. Thus, the cost of the memory is only insignificantly increased while bandwidth is greatly increased.

An improvement to the fast page mode of operation utilizes an extended data out (EDO) technique. Referring to the timing diagram shown in FIG. 1, in the fast page mode, a data buffer is turned on for data access on the falling edge of a column access strobe ($\overline{CAS}$) signal pulse and the data buffer is turned off at the rising edge of the $\overline{CAS}$ pulse. Using the EDO technique which is shown in the timing diagram of FIG. 2, the data buffers are always turned on. EDO keeps the output drivers on even after $\overline{CAS}$ goes high. Therefore it is not necessary to wait for valid data to appear before starting the next $\overline{CAS}$ cycle. Accordingly, the EDO technique allows a shorter $\overline{CAS}$ clock cycle. By shortening the $\overline{CAS}$ clock cycle, the speed performance of the memory is improved. The EDO technique furnishes an improvement in memory speed performance over the fast page mode with only an insignificant change in circuitry.

Accordingly, a technique and circuit are needed which improve memory speed performance over the extended data out (EDO) mode of operation and that do not significantly increase circuit size or cost.

The present invention address such a need.

SUMMARY OF THE INVENTION

In accordance with the present invention, a memory is modified so that read and write data are transferred on both rising and falling edges of a timing signal, thereby essentially doubling the data transfer rate from memory. In one embodiment, a dual-edge extended data out ($DE^2DO$) memory includes modified and improved circuits and operating methods, as compared to a standard extended data out (EDO) memory, so that read and write data are transferred on both rising and falling edges of a timing signal. In a described embodiment, $DE^2DO$ dynamic RAM (DRAM) reads and writes data on the rising and falling edges of a column address strobe ($\overline{CAS}$) timing signal. By transferring data on both the rising and falling edges of the timing signal, the data transfer rate to and from the memory is effectively doubled.

The $DE^2DO$ memory selectively and controllably operates either in the standard EDO operating mode or the double-speed $DE^2DO$ operating mode. The operating mode is selected on a row-by-row access basis.

In accordance with one aspect of the present invention, a method for improving memory speed performance in random access memories includes setting first cycle timing with a read, write, or read-write access to a random access memory (RAM), and proceeding with access to the RAM according to extended data out (EDO) timing procedures. The method further includes utilizing dual edges of a column access strobe signal to extend the EDO access and increase performance speed when driving data transfers to and from a data buffer within the RAM. The method further includes utilizing a bit of an address signal in conjunction with the column address strobe signal to extend the EDO access. In addition, an output enable signal is utilized to determine whether the dual edges are utilized in a current cycle.

In accordance with another aspect of the present invention, a random access memory (RAM) device with improved performance speed, the RAM device including a memory array of elements addressed in a plurality of rows and a plurality of columns, and a row buffer and a column buffer for determining a row and column address of a memory element being accessed, further includes a clock generation mechanism for receiving a plurality of signals, including a row address strobe and a column address strobe, and for generating a plurality of timing control signals, the plurality of timing signals including a column address strobe. The RAM device further includes a buffer mechanism coupled to the clock generation mechanism for receiving at least two of the plurality of timing control signals and for facilitating data input and output from the RAM device. Additionally, the RAM device includes a selection mechanism coupled to the buffer mechanism and the memory array, the selection mechanism receiving a selection signal from the column buffer to assist in accessing data in the memory array, wherein accessing data occurs on dual edges of the column address strobe signal.

Many advantages are gained using the $DE^2DO$ circuit and method. A primary advantage is that the data transfer rate is improved by 100% with substantially no change in circuit cost or size. Another advantage of the described dual-edge extended data out memory is that, compared to a standard extended data out memory, twice the data bandwidth is achieved using a circuit that is substantially the same in terms of size and cost. A $DE^2DO$ DRAM combines the advantages of conventional EDO operation with the advantages of burst mode, effectively doubling the data transfer rate while maintaining the address order flexibility of EDO, an advantage that burst mode alone lacks.

In graphics display memory systems applications the $DE^2DO$ circuit and method are particularly advantageous. The significantly improved transfer rate of the described $DE^2DO$ memory is advantageously used to increase the speed of large sequential data transfers such as display refresh transfers, large copies, image fill-ins and the like.

Further advantages arise because the $DE^2DO$ operating mode is a modified and extended version of the standard EDO operating mode. Thus, two words of consecutive data, i.e., data having addresses which differ only in the value of the least significant address bit AØ, are accessed followed by another two words at any different consecutive addresses within the same page. Because data is accessible in this manner, vertical data accesses in a rectangularly-addressed memory, such as a frame buffer, take place with no additional overhead within the same page for two to four raster lines in a typically-dimensioned memory having 8 bits per pixel and a 32 or 64 bit wide memory. This substantial reduction in data access overhead allows significant performance improvements during small data copies or data fills, such as textual data fills.

The peak data transfer rate of the described $DE^2DO$ memory is significantly higher than the rate of a standard EDO memory, for example, a 100 MHz $DE^2DO$ memory as compared to a 50 MHz EDO memory. However, the two memories are fabricated at substantially the same cost and may be sold for a comparable price, thereby greatly enhancing the cost/performance character of circuits such as graphics controllers.

It is also advantageous that the disclosed circuit and method of operation easily supports implementations of functional units, such as memory controllers, having different-sized data paths. For example, a memory controller for interfacing to a 32-bit data bus using two 32-bit $DE^2DO$ DRAM arrays can be converted into a 64-bit array using an additional 32-bit bank of latches or a multiplexer.

It is further advantageous that the described $DE^2DO$ circuit and operating mode substantially increase memory speed performance without increasing the system clock rate. Thus, improvements in DRAM memory circuits that increase the clock rate can be implemented using the $DE^2DO$ technique to further substantially improve memory performance.

The described $DE^2DO$ circuit and operating mode advantageously achieve these performance improvements without requiring additional pins for accessing additional parallel data lines, in contrast to other memory speed improvement techniques utilize a wider bus to increase bandwidth, disadvantageously increasing memory cost and size.

DETAILED DESCRIPTION

The present invention relates to improved memory speed performance in dynamic random access memories. The following description is presented to enable one of ordinary skill in the art to make and use the invention and is provided in the context of a patent application and its requirements. Various modifications to the preferred embodiment and the generic principles and features described herein will be readily apparent to those skilled in the art. Accordingly, the following is to be considered descriptive and not restrictive of the present invention.

Figure 1:
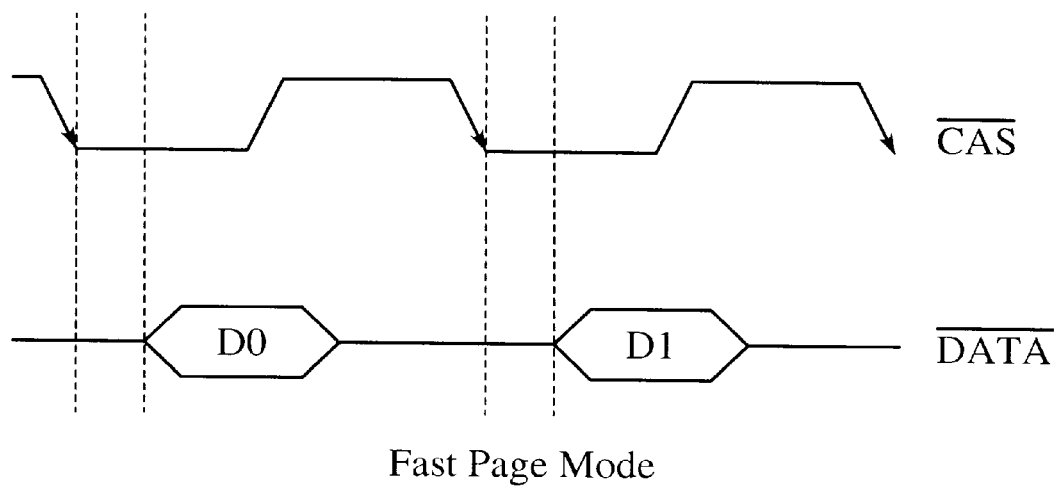
FIG. 1, labeled prior art, is a timing diagram illustrating the timing of a memory data access using a fast page mode.
Figure 2:
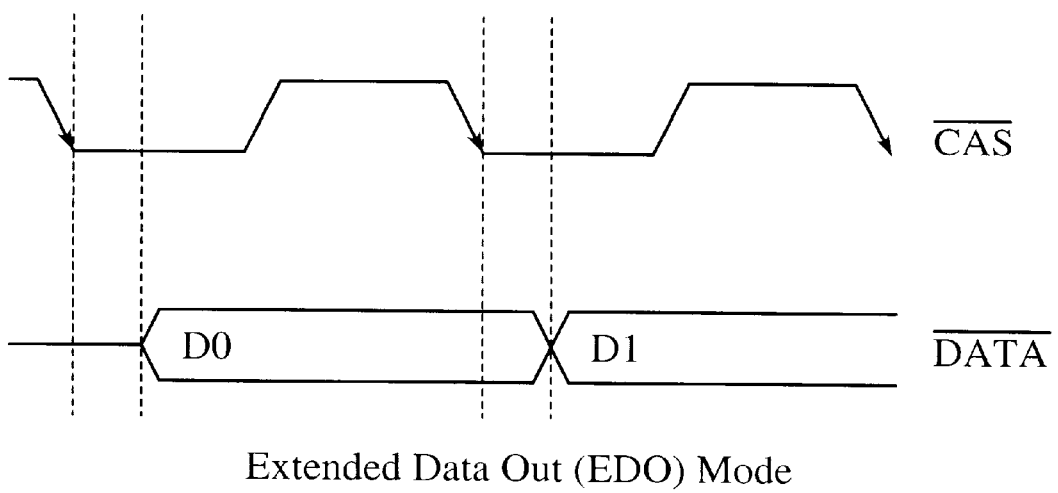
FIG. 2, labeled prior art, is a timing diagram illustrating the timing of a memory data access using an extended data out (EDO) mode.
Figure 3:
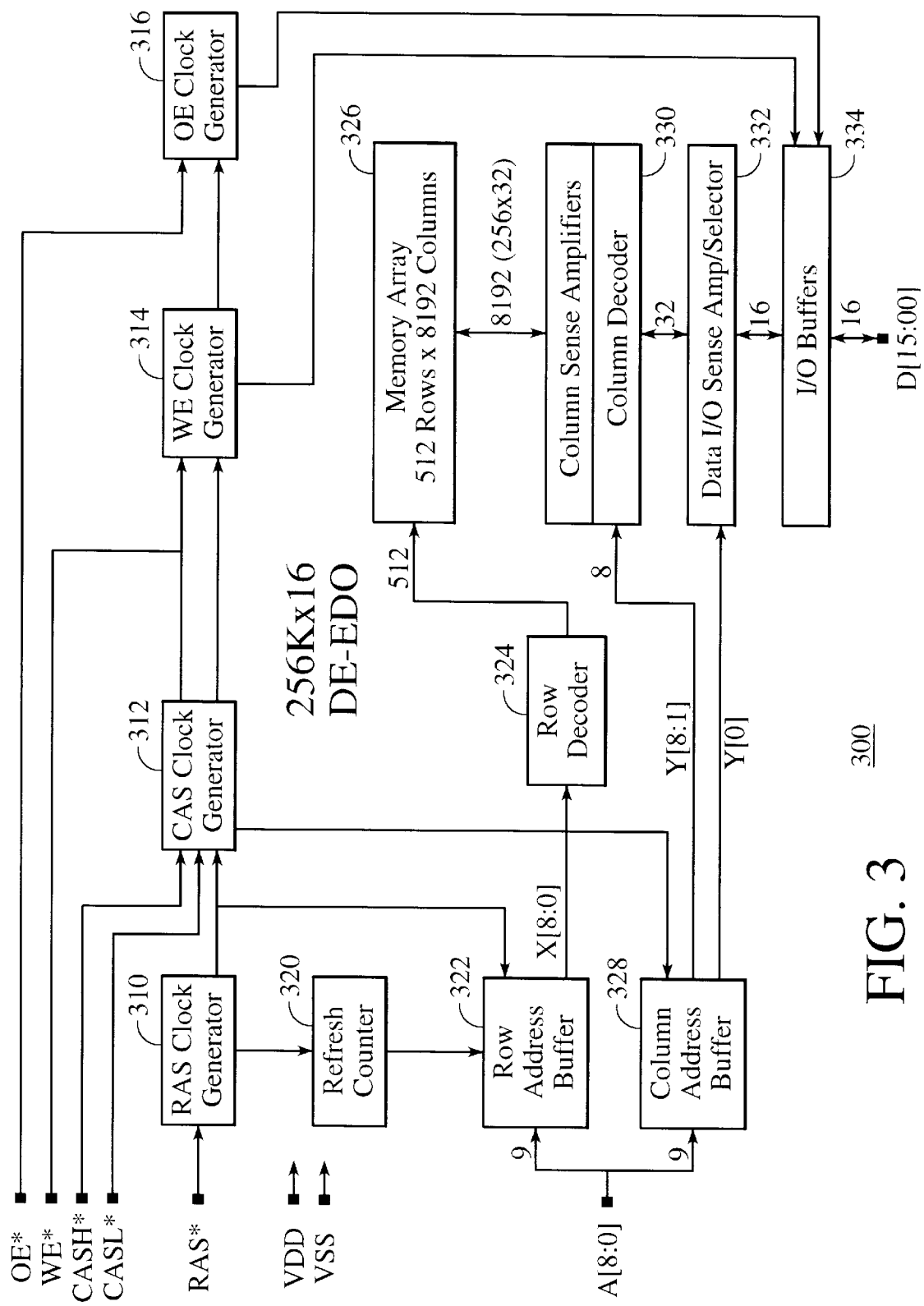
FIG. 3 is a block diagram which illustrates functional blocks of an embodiment of a Dual Edge, Extended Data Out Dynamic Random Access Memory ($DE^2DO$ DRAM) in accordance with the present invention.

Referring to FIG. 3, a block diagram illustrates functional blocks of a 256K×16 Dual Edge, Extended Data Out Dynamic Random Access Memory ($DE^2DO$ DRAM) 300. The $DE^2DO$ DRAM 300 is modified in comparison to typical memory circuits so that read and write data are transferred on both rising and falling edges of a timing signal, thereby essentially doubling the data transfer from memory. In typical operation of a conventional EDO DRAM, data is accessed in four burst accesses with four addresses applied to an address bus and four doublewords accessed in memory. In the $DE^2DO$ DRAM 300, data is accessed in bursts of two accesses with two addresses applied to the address bus but each access resulting in the access of two double words. The address may be incremented or decremented. For example, if the memory is addressed with addresses 0, 2, 4 and 6, then doublewords 0, 1, 2, 3, 4, 5, 6 and 7 are accessed. If the memory is decremented so that the memory is addressed with addresses 7, 5, 3 and 1, then doublewords 7, 6, 5, 4, 3, 2, 1 and 0 are accessed.

The $DE^2DO$ DRAM 300 is depicted as a 256K×16 DRAM for illustrative purposes alone, and it should be appreciated that the $DE^2DO$ can be implemented in any DRAM memory configuration in accordance with the scope of the present invention.

The DE²DO DRAM 300 includes a row address strobe (RAS) clock generator 310 which is connected to a $\overline{\text{RAS}}$ input line, a column address strobe (CAS) clock generator 312 which receives input signals from a $\overline{\text{CAS}}$ high (CASH) line, a $\overline{\text{CAS}}$ low (CASL) line and an output signal from the RAS clock generator, a write enable (WE) generator 314, which receives a write enable $\overline{(\text{WE})}$ input signal and an output signal from the CAS clock generator 312 and an output enable (OE) clock generator 316 receiving input signals from an output enable $\overline{(\text{OE})}$ line and from an output terminal of the WE clock generator 314. A clock signal from the RAS clock generator 310 is applied to a refresh counter 320 to generate a count signal which is applied to control a row address buffer 322 in combination with a RAS clock signal from the RAS clock generator 310. The row address buffer 322 receives address signals from the address bus A[8:0] and stores an address designation which is applied to a row decoder 324. The row decoder 324, in turn, applies decoded row address signals to a 512-row by 8192-column memory array 326. A column address buffer 328 also is connected to receive the address signals from the address bus A[8:0], under control of a control signal from the CAS clock generator 312. The column address buffer 328 applies 8-bit address signals Y[8:1] to a column decoder circuit 330. The column address buffer 328 applies the remaining column address bit signal Y[0] to a data I/O sense amplifier and selector circuit 332. The memory array 326 applies 8192 column data bits, as selected by the row decoder 324, to the column sense amplifiers and column decoder circuit 330 in the form of 256 32-bit extended words. The eight-bit column address Y[8:1] applied by the column address buffer 328 to the column sense amplifiers and column decoder circuit 330 selects one 32-bit extended word from the 256 extended words. The single column address bit Y[0] is applied to the data I/O sense amplifier and selector circuit 332 to select a 16-bit word from the 32-bit extended word and apply the 16-bit word to an I/O buffer 334. The I/O buffer 334 communicates the 16-bit word to a data bus D[15:0].

The RAS clock generator 310, CAS clock generator 312, WE clock generator 314 and OE clock generator 316 control generation of a sequence of delayed timing signals that are triggered by the $\overline{\text{RAS}}$, $\overline{\text{CAS}}$, $\overline{\text{WE}}$ and $\overline{\text{OE}}$ input timing signals. For example, typically in a DRAM that supports fast page mode operations, the CAS clock generator 312 also generates an output buffer access delay interval time signal that times a delay interval between the $\overline{\text{CAS}}$ falling edge and the turn-on time of the data buffer. This output buffer access delay interval time signal is used in fast page mode to activate the data buffer at the delay following the falling edge of $\overline{\text{CAS}}$ and deactivate the data buffer at the rising edge of the $\overline{\text{CAS}}$ signal.

The row address buffer 322 and the column address buffer 328 time multiplex the address lines A[8:0] at the beginning of a memory cycle using two clocks, the row address strobe $\overline{\text{RAS}}$ and the column address strobe $\overline{\text{CAS}}$. The address lines A[8:0] are time multiplexed into a 9-bit row address and a 9-bit column address. In each read or write memory cycle, a $\overline{\text{RAS}}$ active transition occurs, followed by a $\overline{\text{CAS}}$ active transition after a $\overline{\text{RAS}}$ to $\overline{\text{CAS}}$ delay time. The delay time is typically used to set up external addressing to the DRAM 300.

A clock signal line connected from the RAS clock generator 310 to the CAS clock generator 312 controls the CAS clock generator 312 so that an external $\overline{\text{CAS}}$ signal is enabled only when a $\overline{\text{RAS}}$ signal internal to the DRAM 300 is activated. Thus, an external $\overline{\text{CAS}}$ signal enables an internal $\overline{\text{CAS}}$ line as soon as a row address hold time has expired.

The DE²DO DRAM 300 operates in several different data transfer cycle protocols including read, write cycles and read-write cycle protocols. For each of these data transfer cycle protocols, the DE²DO DRAM 300 functions in either an extended data out (EDO) mode or a dual-edge extended data out (DE²DO) mode. The EDO mode is an extension of and functions in compliance with a standard fast page mode. The DE²DO mode is an extension of and functions in compliance with the EDO mode.

A read cycle begins by addressing the DRAM 300 as previously described with $\overline{\text{RAS}}$ and $\overline{\text{CAS}}$ active transitions activating the latching of bit locations selected by address lines A[8:0]. The read mode is enabled when the write signal $\overline{\text{WE}}$ is a logic high level for a sufficient time interval prior to the CAS active transition. Valid data is furnished by the memory array 326 when the CAS signal becomes active following the preceding $\overline{\text{RAS}}$ signal. Otherwise, the valid data is furnished following the previous $\overline{\text{CAS}}$ falling edge.

$\overline{\text{RAS}}$ and $\overline{\text{CAS}}$ remain active for minimum time intervals to complete a read cycle. Write signal $\overline{\text{WE}}$ remains high throughout the cycle plus sufficient time intervals after $\overline{\text{RAS}}$ and $\overline{\text{CAS}}$ active transitions to maintain the data at a bit location. After a $\overline{\text{RAS}}$ inactive transition, $\overline{\text{RAS}}$ remains inactive to precharge the DE²DO DRAM 300 internal circuits for a subsequent active cycle. Read data is valid, but not latched, while the $\overline{\text{CAS}}$ remains active. When $\overline{\text{CAS}}$ transitions to an inactive state, the data output is tristated.

The DE²DO DRAM 300 also utilizes several different write cycles, including an early write cycle, a late write cycle, a page mode early write, a page mode read-write cycle, an extended data out (EDO) write and dual-edge extended data out (DE²DO) mode versions of the cycles. A normal write cycle begins by addressing the DRAM 300 as previously described as $\overline{\text{RAS}}$ and $\overline{\text{CAS}}$ active transitions activate latching of bit locations selected by address lines A[8:0]. The write signal $\overline{\text{WE}}$ goes to a low level to enable the write mode. In the early write mode, the write signal $\overline{\text{WE}}$ transitions to an active low level following the active transition of a preceding $\overline{\text{CAS}}$ signal. Data on the data lines D(15:0) is referenced to $\overline{\text{CAS}}$ in an early write cycle. The $\overline{\text{RAS}}$ and $\overline{\text{CAS}}$ clocks remain active after the start of an early write cycle to complete the cycle. The write data remains in a tristate condition throughout an early write cycle because the write signal $\overline{\text{WE}}$ active transition occurs before or simultaneously with a $\overline{\text{CAS}}$ active transition so that data-out buffers are disabled.

A late write cycle takes place when a write signal $\overline{\text{WE}}$ active transition occurs after a $\overline{\text{CAS}}$ active transition. Data on the data lines D(15:0) is referenced to $\overline{\text{WE}}$ in a late write cycle. The $\overline{\text{RAS}}$ and $\overline{\text{CAS}}$ clocks remain active after the $\overline{\text{WE}}$ active transition to complete the cycle.

During a single read-write cycle, the DE²DO DRAM 300 first executes a read operation, which is immediately followed by a write operation at the same address. The read-write cycle is essentially the same as a late write cycle, except that the write signal $\overline{\text{WE}}$ is controlled to remain high for a selected time interval after the $\overline{\text{CAS}}$ active transition so the data is held valid before it is written.

Fast page mode read, write and read-write operations are fast successive data transfers at multiple column locations of a selected row of the memory array 326. Fast page mode operations can be performed serially in consecutive page mode cycles or can be intermixed with standard cycles. A typical read access time in fast page mode is approximately half the regular $\overline{\text{RAS}}$ access time. Fast page mode achieves this increase in speed by maintaining the row address strobe RAS signal active while toggling the column address strobe $\overline{CAS}$ between high and low signal levels. A row is latched by a $\overline{RAS}$ active signal transition, while each $\overline{CAS}$ active transition selects a column location on the row. The selected column may successively change or may remain the same.

A fast page mode cycle begins with a standard read, write, or read-write cycle, in accordance with previous description, which defines and sets first cycle timing. Fast page mode timing follows in subsequent cycles as the $\overline{CAS}$ signal transitions to the inactive level for a $\overline{CAS}$ precharge interval while $\overline{RAS}$ remains a logic low level. The second $\overline{CAS}$ active transition while $\overline{RAS}$ remains low begins the first page mode cycle. Fast page mode operation is terminated when $\overline{RAS}$ transitions to inactive at the same time or shortly following a $\overline{CAS}$ inactive transition.

An extended data out (EDO) mode cycle, like the fast page mode cycle, starts with a standard read, write, or read-write cycle which defines and sets first cycle timing. EDO mode timing and timing signals are essentially the same as fast page mode timing and timing signals except for an output buffer access delay. In the fast page mode and the EDO mode, the falling edge of the $\overline{CAS}$ signal initiates timing of the output buffer access delay. When the output buffer access delay passes, the data buffer D[8:0] is activated. In the fast page mode, but not the EDO mode, the rising edge of the $\overline{CAS}$ signal deactivates the data buffer D[8:0]. Instead, in the EDO mode, the data buffer D[8:0] is not deactivated, but rather the next sequential $\overline{CAS}$ signal falling edge switches to the next data output. EDO keeps the output drivers on even after $\overline{CAS}$ goes high. Therefore it is not necessary to wait for valid data to appear before starting the next CAS cycle.

The dual-edge extended data out ($DE^2DO$) mode is an extension of the EDO mode and further increases by two times the amount of data switched in each cycle. Like the fast page mode and EDO mode operation, $DE^2DO$ mode begins with a standard read, write, or read-write cycle which defines and sets first cycle timing. $DE^2DO$ mode timing and timing signals are essentially the same as EDO mode timing and timing signals except for timing signals driving data transfers to and from the data buffer D[8:0]. In the $DE^2DO$ mode, both the rising edge and the falling edge of the $\overline{CAS}$ signal initiate timing of the output buffer access delay interval. When this time interval expires, the data buffer D[8:0] switches to transfer the next data output.

Figure 4:
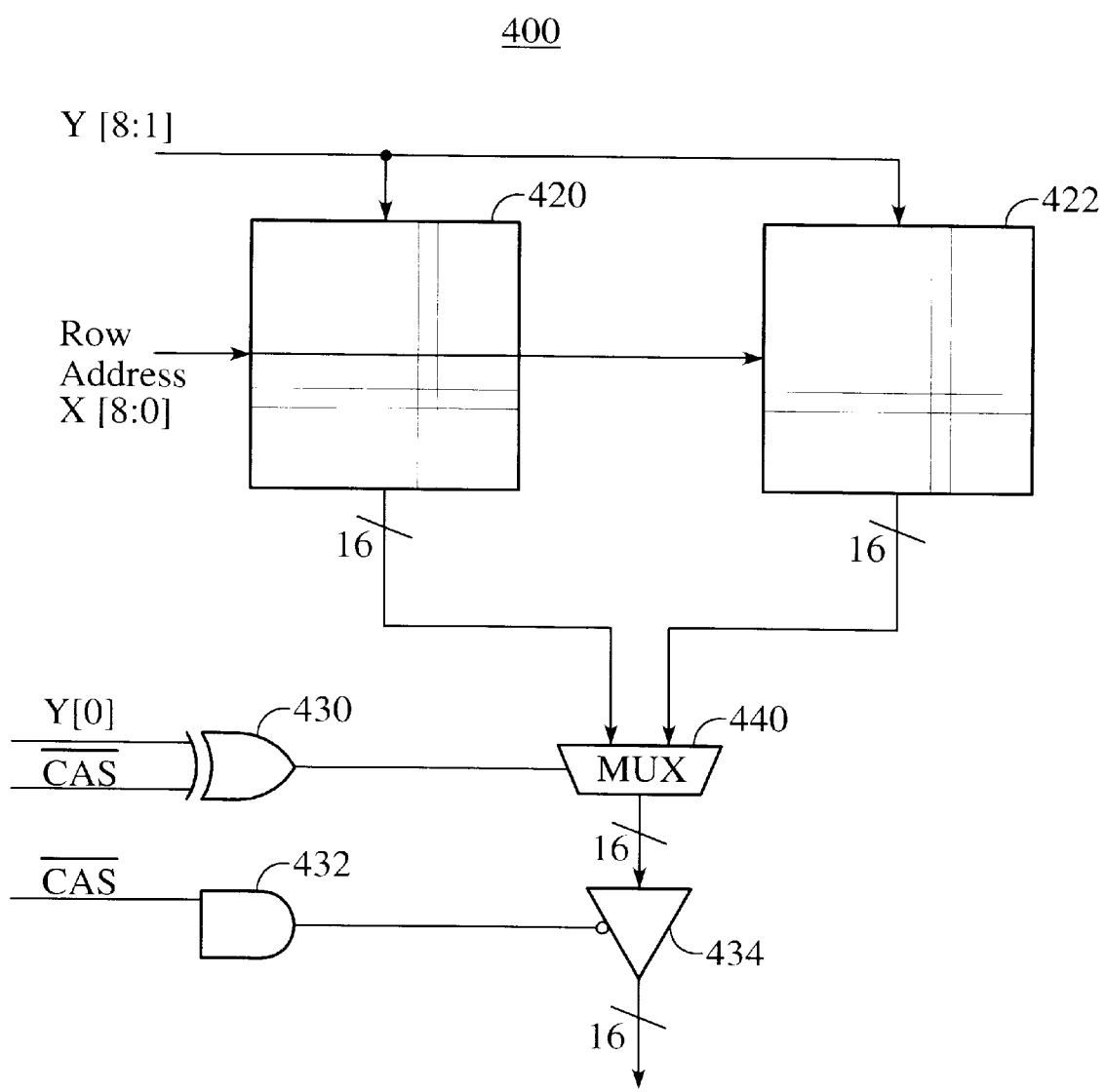
FIG. 4 is a mixed block and circuit schematic diagram that illustrates an embodiment of a $DE^2DO$ DRAM circuit.

Referring to FIG. 4, a mixed block and circuit schematic diagram illustrates an embodiment of a $DE^2DO$ DRAM memory controller circuit 400. The $DE^2DO$ DRAM memory controller circuit 400 includes a conventional EDO DRAM memory controller circuit with additional control circuitry for implementing dual-edge data transfer capabilities. Further, the memory controller 400 generates all addresses, thus diminishing a need for a burst address counter. Column address lines Y[8:1] are applied to both memory array high-doublebyte section 420 and memory array low-doublebyte section 422 to specify two target data doublebytes, one doublebyte from each memory array section. Address line Y[0] selects the memory array high-doublebyte section 420 when at a high logic level and selects the memory array low-doublebyte section 422 when at a low logic level. A 32-bit word is thereby selected by the address lines Y[8:1]. The 32-bit word is applied to a multiplexer 440 which selects either the high-doublebyte or the low-doublebyte under control of exclusive-OR gate 430. Column address strobe signal $\overline{CAS}$ and address line Y[0] are input signals to exclusive-OR gate 430 so that either the high-order doublebyte or the low-order doublebyte is selected depending on whether the $\overline{CAS}$ edge is a rising edge or a falling edge. In addition, exclusive-OR gate 430 operates as a one-bit counter for counting column address bit A0. AND-gate 432 enables transfer of the selected doublebyte under control of the $\overline{CAS}$ signal. The additional control circuitry thus provides for selection between $DE^2DO$ and EDO operating modes and toggling to control selection of an appropriate data word.

Figure 5A:
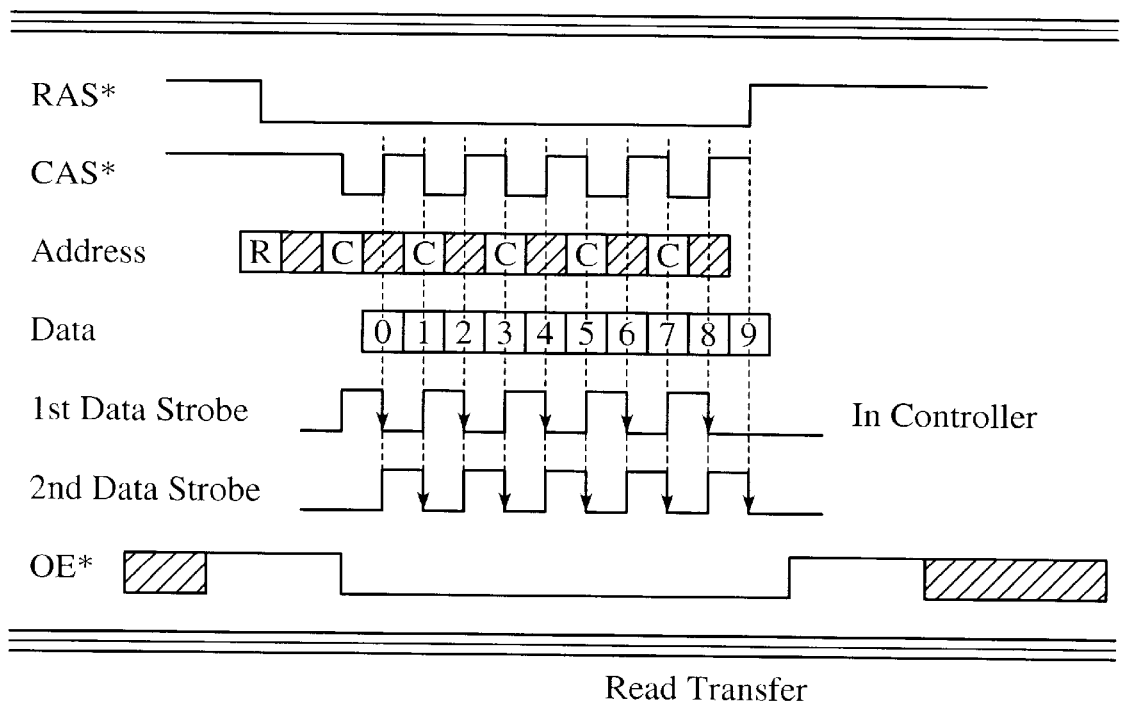
FIGS. 5A and 5B illustrate timing diagrams showing a $DE^2DO$ memory interface protocol in accordance with the present invention.
Figure 5B:
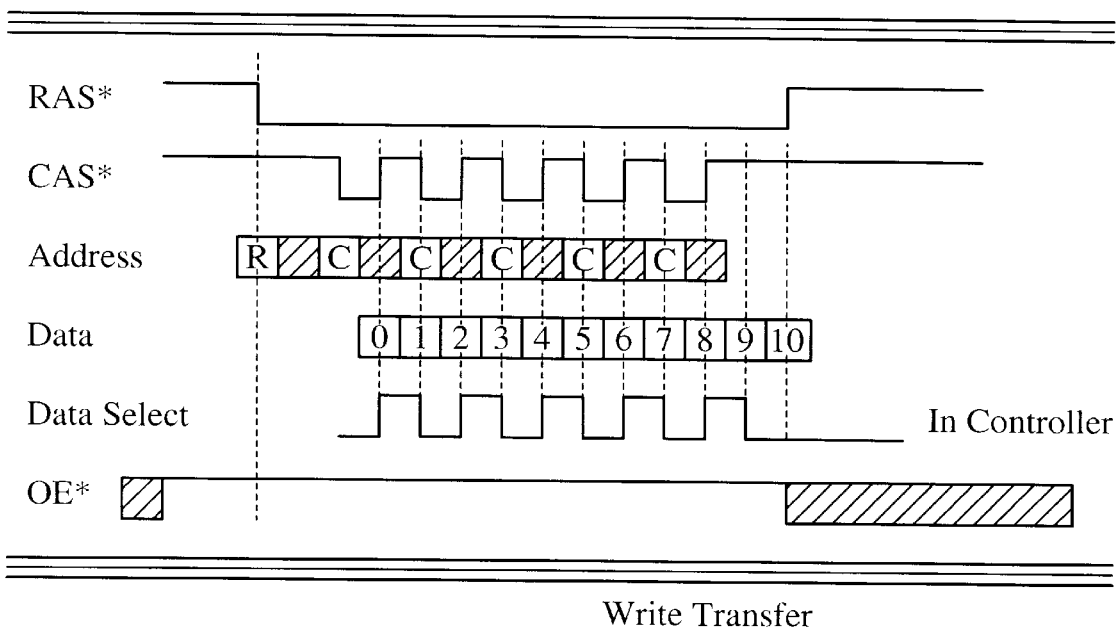

FIGS. 5A and 5B are timing diagrams that illustrate a $DE^2DO$ memory interface. The $DE^2DO$ memory interface protocol is a combination of an extended data out (EDO) protocol in accordance with the JEDEC (Joint Electron Device Engineering Council) Standard and a burst protocol. Row address strobe $\overline{RAS}$, column address strobe $\overline{CAS}$ and address signals comply with the standard EDO device protocol. In accordance with the JEDEC EDO standard protocol, one column address must be provided by a memory controller at the falling edge of each $\overline{CAS}$ pulse. Data is transferred on the falling edge of the $\overline{CAS}$ pulse.

Referring to FIG. 5A, which illustrates a "read" data access, data must be valid on the rising edge of the $\overline{CAS}$ pulse and remains valid until the next falling edge of the $\overline{CAS}$ pulse. On this next falling edge of the $\overline{CAS}$ pulse, the accessed data changes to the data word that is addressed with the least significant address bit A0 toggled. The data transfer mode, either $DE^2DO$ mode or EDO mode, is specified at the assertion of a row address strobe $\overline{RAS}$ pulse and functions in a manner similar to a burst transfer mode. The last data word remains valid until the $\overline{RAS}$ signal is deasserted.

Referring to FIG. 5B, a "write" $DE^2DO$ data access, which complies with the JEDEC EDO standard protocol and burst mode operation, is performed in a manner which is similar to a read operation. The address is specified at the falling edge of each $\overline{CAS}$ pulse and the first data word to be written must be valid on the falling edge of the $\overline{CAS}$ pulse. The second data word to be written must be valid on the subsequent rising edge of the $\overline{CAS}$ pulse. The last data word is latched on deassertion of the $\overline{RAS}$ pulse. The memory controller utilizes the $\overline{CAS}$ pulse as a control signal which selects the data word to drive on the memory data bus.

Figure 6A:
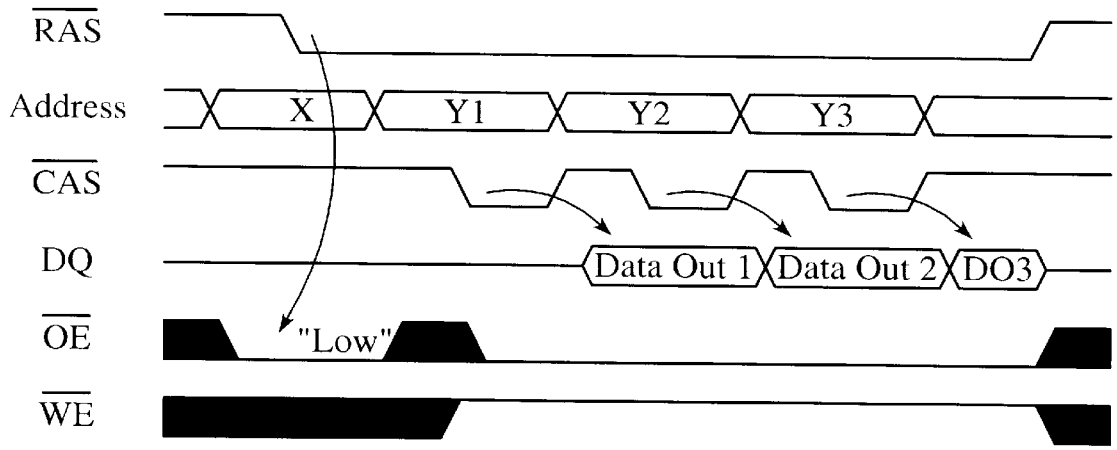
FIGS. 6A and 6B depict timing diagrams which respectively show an extended data out (EDO) read timing signal and an extended data out (EDO) write timing signal in accordance with one embodiment of the present invention.
Figure 6B:
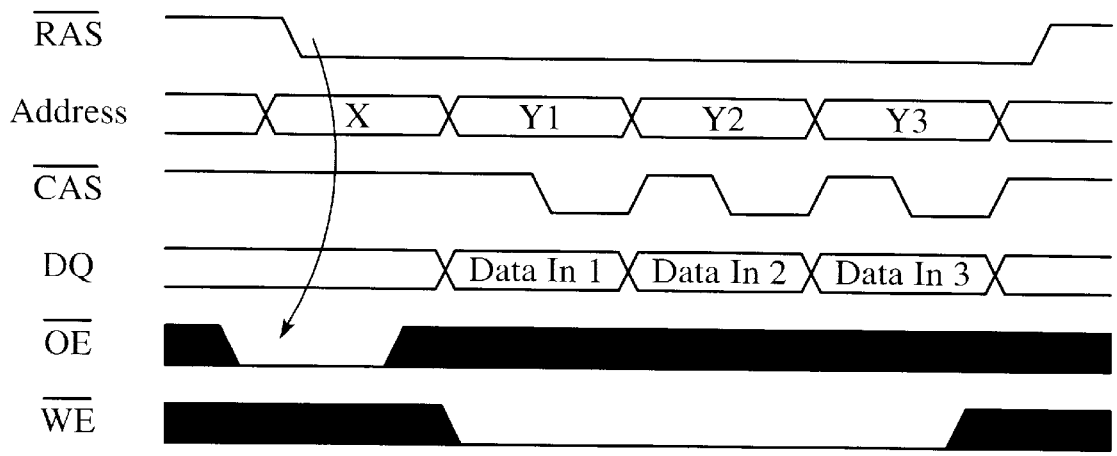

Referring to FIGS. 6A and 6B, an extended data out (EDO) read timing signal and an extended data out (EDO) write timing signal are respectively shown. Also referring to FIGS. 7A and 7B, a dual-edge, extended data out ($DE^2DO$) read timing signal and a double-edge, extended data out ($DE^2DO$) write timing signal are respectively shown. The timing diagrams shown in FIGS. 6A, 6B, 7A and 7B are discussed in conjunction with the block diagram of the $DE^2DO$ DRAM 300, which is shown in FIG. 3. At the falling edge of the $\overline{RAS}$ signal, the column address strobe $\overline{(CAS)}$ and the output enable $\overline{(OE)}$ signal levels are evaluated to determine whether the DRAM 300 is to perform a regular extended data out (EDO) cycle or a dual edge EDO ($DE^2DO$) cycle. When $\overline{CAS}$ is a logic high and $\overline{OE}$ is a logic low at the $\overline{RAS}$ falling edge, the DRAM 300 enters an EDO cycle. If both $\overline{CAS}$ and $\overline{OE}$ are a logic high at the RAS falling edge, the DRAM 300 enters a $DE^2DO$ cycle. When $\overline{RAS}$ subsequently goes to a logic high, the cycle, either EDO or $DE^2DO$, is terminated.

When $\overline{RAS}$ is a logic low level, a $\overline{CAS}$ falling edge latches the column address in either the EDO cycle or the $DE^2DO$ cycle. The column address is latched in the column address buffer 328 through the operation of the CAS clock generator 312.

Figure 7A:
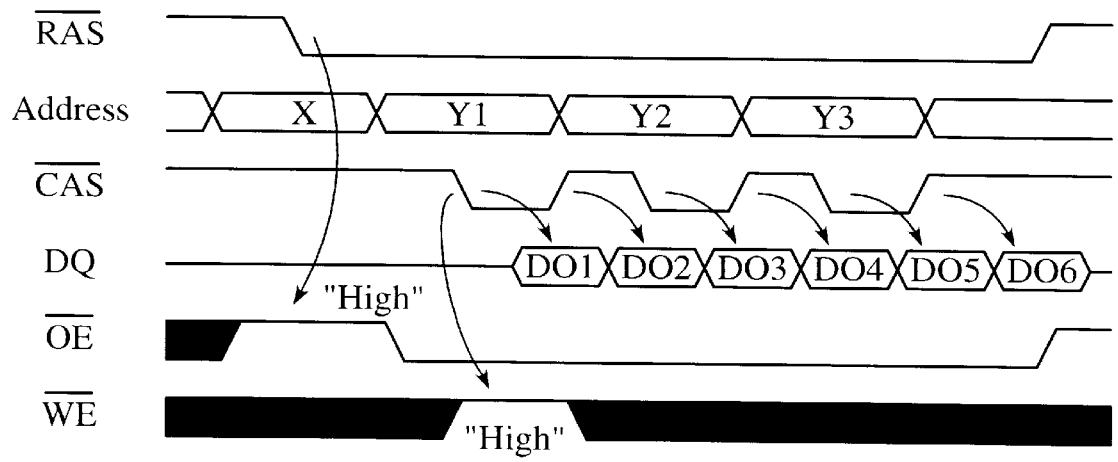
FIGS. 7A and 7B illustrate timing diagrams which show a dual-edge, extended data out ($DE^2DO$) read timing signal and a double-edged, extended data out ($DE^2DO$) write timing signal in accordance with the present invention.
Figure 7B:
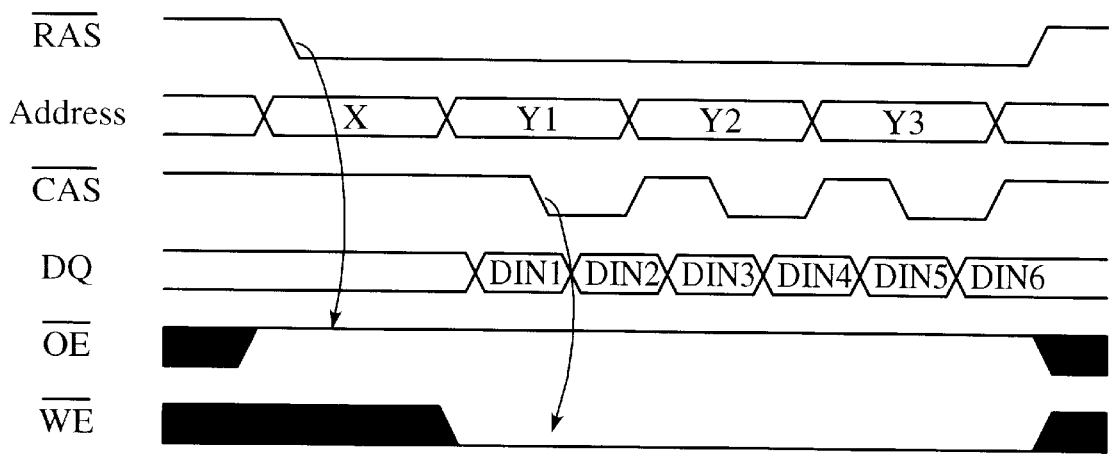

However, in the $DE^2DO$ cycle, the first $\overline{CAS}$ falling edge following the $\overline{RAS}$ falling edge controls whether the operation performed is a page read or a page write operation in accordance with the level of the write enable ($\overline{WE}$) signal as is shown in FIGS. 7A and 7B. Once the page read or page write operation is selected, the subsequent $\overline{CAS}$ signal executes the selected dual edge page read or dual edge page write operation until the $\overline{RAS}$ signal goes to a high logic level. The address transfer rate during the $DE^2DO$ data transfer operation is the same as the address transfer rate of a conventional EDO memory access, once per $\overline{CAS}$ pulse, and the access time to a first data word is the same as for the conventional EDO memory. However, in a $DE^2DO$ read cycle, two data elements addressed by the column address are fetched in each $\overline{CAS}$ cycle. For any column address [A8, A7, A6 ... A2, A1, A0], the two memory array 326 locations addressed as [A8, A7, A6 ... A2, A1, 1] and [A8, A7, A6 ... A2, A1, 0] are read out. If A0 is equal to 0 during the $\overline{CAS}$ falling edge, then the first data element addressed by the latched column address [A8, A7, A6 ... A2, A1, 0] is read out in the $\overline{CAS}$ high to low transition and the second element of data addressed by the latched column address [A8, A7, A6 ... A2, A1, 1] is read out by the $\overline{CAS}$ low to high transition. Conversely, if A0 is equal to 1 during the $\overline{CAS}$ falling edge, then the first data element addressed by the latched column address [A8, A7, A6 ... A2, A1, 1] is read out in the $\overline{CAS}$ high to low transition and the second element of data addressed by the latched column address [A8, A7, A6 ... A2, A1, 0] is read out by the $\overline{CAS}$ low to high transition.

Similarly, in a $DE^2DO$ write cycle, two data elements addressed by the column address are written in each $\overline{CAS}$ cycle. For any column address [A8, A7, A6 ... A2, A1, A0], the two memory array 326 locations addressed as [A8, A7, A6 ... A2, A1, 1] and [A8, A7, A6 ... A2, A1, 0] are written. If A0 is equal to 0 during the $\overline{CAS}$ falling edge, then the first data element addressed by the latched column address [A8, A7, A6 ... A2, A1, 0] is written in the CAS high to low transition and the second element of data addressed by the latched column address [A8, A7, A6 ... A2, A1, 1] is written by the $\overline{CAS}$ low to high transition. Conversely, if A0 is equal to 1 during the $\overline{CAS}$ falling edge, then the first data element addressed by the latched column address [A8, A7, A6 ... A2, A1, 1] is written in the $\overline{CAS}$ high to low transition and the second element of data addressed by the latched column address [A8, A7, A6 ... A2, A1, 0] is written by the $\overline{CAS}$ low to high transition.

In all cases, whether A0 is 0 or 1 during the CAS falling edge, the high order 8 bits of the address [A8, A7, A6 ... A2, A1] are always the same.

Thus, at any $\overline{CAS}$ cycle time, twice the amount of data is either read or written into the memory array 326 in the dual edge EDO cycle, as compared to the regular EDO cycle. This result is achieved although the timing for the dual edge EDO and regular EDO cycles are identical for the $\overline{CAS}$ and address format. Accordingly, twice the memory performance is achieved using $DE^2DO$ operation. Conceptually, the $DE^2DO$ DRAM operates in the manner of a burst DRAM, with a burst limit of 2 words, rather than the burst limit which is equal to the DRAM page size in the burst DRAM standard definition.

Although the present invention has been described in accordance with the embodiments shown, one of ordinary skill in the art will recognize that there could be variations to the embodiment and those variations would be within the spirit and scope of the present invention. Accordingly, many modifications may be made by one of ordinary skill without departing from the spirit and scope of the present invention, the scope of which is defined by the following claims.

What is claimed is:

1. A method for improving memory speed performance in random access memories, the method comprising:
   setting first cycle timing with a read, write, or read-write access to a random access memory (RAM);
   proceeding with access to the RAM according to extended data out (EDO) timing procedures; and
   transferring data on falling and rising edges of a column address strobe signal to extend the EDO access when driving data to and from a data buffer within the RAM.

2. The method of claim 1 further comprising utilizing a bit of an address signal in conjunction with the column address strobe signal to extend the EDO access.

3. The method of claim 2 further comprising utilizing a least significant bit of the address signal.

4. The method of claim 3 further comprising using the least significant bit and the column address strobe signal to toggle between accessing high or low double-bytes of data from memory array sections within the RAM.

5. The method of claim 1 further comprising utilizing an output enable signal at a falling edge of a row address strobe signal to determine whether the falling and rising edges are utilized in a current cycle.

6. The method of claim 5 wherein when the output enable signal is at a same logic level as the column address strobe, at the falling edge of the row address strobe signal the falling and rising edges are utilized in the current cycle.

7. The method of claim 5 wherein when the output enable signal is not at a same logic level as the column address strobe, at the falling edge of the row address strobe signal the falling and rising edges are not utilized in the current cycle and a regular extended data out cycle occurs.

8. A random access memory (RAM) device with improved performance speed, the RAM device including a memory array of elements addressed in a plurality of rows and a plurality of columns, and a row buffer and a column buffer for determining a row and column address of a memory element being accessed, the RAM device comprising:
   clock generation means for receiving a plurality of signals, including a row address strobe and a column address strobe, and for generating a plurality of timing control signals, the plurality of timing signals including an internal column address strobe;
   a buffer means coupled to the clock generation means for receiving at least two of the plurality of timing control signals and for facilitating data input and output from the RAM device; and
   a selection means coupled to the buffer means and the memory array, the selection means receiving a selection signal from the column buffer to assist in accessing data in the memory array, wherein accessing data occurs on falling and rising edges of the column address strobe signal.

9. The RAM device of claim 8 wherein the selection signal comprises a least significant bit of an address signal.

10. The RAM device of claim 8 wherein the selection signal selects high and low double-bytes of a section in the memory array.

11. The RAM device of claim 8 wherein the clock generation means further receives an output enable signal, the output enable signal assisting in selection of an operation to allow data access on the falling and rising edges of the column address strobe signal.

12. The RAM device of claim 8 wherein the clock generation means further comprises a row address strobe clock generator receiving the row address strobe.

13. The RAM device of claim 12 wherein the clock generation means further comprises a column address strobe clock generator coupled to the row address strobe clock generator and receiving the column address strobe.

14. The RAM device of claim 13 wherein the clock generation means further comprises a write enable clock generator coupled to the column address strobe clock generator and an output enable clock generator coupled to the write enable clock generator.

15. A method for improving performance speed in a memory device, the method comprising:

providing a random access memory (RAM) capable of extended data out (EDO) operation, the RAM receiving a plurality of signals, including an address signal and a column address strobe signal; and utilizing the column address strobe signal and at least one bit of the address signal to extend the EDO operation by transferring data on the falling and rising edges of the column address strobe signal.

16. The method of claim 15 wherein the at least one bit of the address signal further comprises a least significant bit of the address signal.

17. The method of claim 16 further comprising using the least significant bit and the column address strobe signal to toggle between accessing high or low double-bytes of data from memory array sections within the RAM.

18. The method of claim 15 further comprising utilizing an output enable signal at a falling edge of a row address strobe signal to determine whether the falling and rising edges of the column address strobe signal are utilized in a current cycle.

19. The method of claim 18 further comprising utilizing the falling and rising edges of the column address strobe signal in the current cycle when the output enable signal is at a same logic level as the column address strobe signal at the initiation of a read or write cycle.

20. The method of claim 19 further comprising utilizing a regular EDO cycle when the output enable signal is not at a same logic level as the column address strobe signal at the initiation of a read or write cycle.

* * * * *